United States Patent [19]

Capone et al.

[11] Patent Number: 4,942,151

[45] Date of Patent: Jul. 17, 1990

[54] MAGNETIC PREFERENTIAL ORIENTATION OF METAL OXIDE SUPERCONDUCTING MATERIALS

[75] Inventors: Donald W. Capone; Bobby D. Dunlap, both of Bolingbrook; Boyd W. Veal, Downers Grove, all of Ill.

[73] Assignee: Arch Development Corporation, Argonne, Ill.

[21] Appl. No.: 101,820

[22] Filed: Sep. 28, 1987

[51] Int. Cl.$^5$ ............................ C04B 33/28; B28B 1/26
[52] U.S. Cl. ................................. 505/1; 264/24; 264/28; 264/63; 264/108; 505/741
[58] Field of Search ............ 264/23, 24, 56, 63, 264/28, 86, 108, 109, 118, 125, 115, 140; 252/518, 521; 505/1, 822, 823, 727, 739, 740, 741

[56] References Cited

U.S. PATENT DOCUMENTS 1,918,848  7/1933  Land et al. ........................... 264/24
3,073,732  1/1963  Hundsdiecker ..................... 264/24

OTHER PUBLICATIONS

Poeppel et al., "Fabrication of YBa$_2$Cu$_3$O$_7$ Superconducting Ceramics", ACS Symposium Series 351, pp. 261–265, Aug. 30–Sep. 4, 1987.
Hor et al., "Superconductivity above 90K . . . ", Physical Review Letters, vol. 58, No. 18, May 4, 1987, pp. 1891–1894.
Johnson et al., "Fabrication of Ceramic Articles from High Tc Superconducting Oxides", *High Temperature Superconductors*, MRS 1987, Spring Meeting, Apr. 1987, pp. 193–195.
Farrell et al., "Superconducting Properties of Aligned Crystalline Grains of Y$_1$Ba$_2$Cu$_3$O$_{7-\delta}$", Phy. Rev. B, vol. 36, No. 7, Sep. 1, 1987, pp. 4025–4027.

*Primary Examiner*—Jan H. Silbaugh
*Assistant Examiner*—MaryLynn Fertig
*Attorney, Agent, or Firm*—Emrich & Dithmar

[57] ABSTRACT

A superconductor comprised of a polycrystalline metal oxide such as YBa$_2$Cu$_3$O$_{7-X}$ (where $0<X<0.5$) exhibits superconducting properties and is capable of conducting very large current densities. By aligning the two-dimensional Cu-O layers which carry the current in the superconducting state in the a- and b-directions, i.e., within the basal plane, a high degree of crystalline axes alignment is provided between adjacent grains permitting the conduction of high current densities. The highly anisotropic diamagnetic susceptibility of the polycrystalline metal oxide material permits the use of an applied magnetic field to orient the individual crystals when in the superconducting state to substantially increase current transport between adjacent grains. In another embodiment, the anisotropic paramagnetic susceptibility of rare-earth ions substituted into the oxide material is made use of as an applied magnetic field orients the particles in a preferential direction. This latter operation can be performed with the material in the normal (non-superconducting) state.

15 Claims, 2 Drawing Sheets

MAGNETIC PREFERENTIAL ORIENTATION OF METAL OXIDE SUPERCONDUCTING MATERIALS

CONTRACTUAL ORIGIN OF THE INVENTION

The United States Government has rights in this invention under Contract No. W-31-109-ENG-38 between the U.S. Department of Energy and the University of Chicago, representing Argonne National Laboratory.

BACKGROUND OF THE INVENTION

This invention relates generally to the fabrication of superconducting materials and is particularly directed to the magnetic orientation of the crystals of a superconducting polycrystalline metal oxide material in a preferred direction for enhanced current carrying capacity.

Certain metals, alloys, and chemical compounds known as superconductors exhibit zero electrical resistivity and complete diamagnetism at very low temperatures and magnetic fields. The transition of a metal from normal electrical conducting properties to superconducting properties depends primarily on (1) the temperature and (2) the magnetic field at the surface of the metal. The superconductive state of the metal exists for temperatures less than its characteristic critical temperature, $T_c$. The most practical superconducting materials exhibit very low critical temperatures, i.e., on the order of 4–23 K. However, recent developments have produced new superconducting materials, based on oxides, having critical temperatures on the order of 100 K.

Superconductors also exhibit a characteristic critical electric current density, $J_c$, measured in amps/cm$^2$. By increasing the current density in a superconducting material to its $J_c$ characteristic value, it can be driven into a normal conducting state. Thus, the current density at which this transition occurs is termed the conductive material's critical current density. It is of course desirable for a superconductor to have a high critical current density to allow it to conduct large currents while remaining superconductive.

In practical Type II superconductors efforts to increase the critical current density have involved the incorporation of microstructural defects in the material. A magnetic field applied to the superconductor penetrates the material in the form of small bundles, or vortices, of magnetic flux which can move about within the material as it conducts current. Movement of these magnetic vortices is a dissipative process characterized by resistive heating and thus represents a limitation in the material's current carrying capacity. Incorporation of the aforementioned microstructural defects within the material prevents the magnetic vortices from moving within the superconductor in response to current flowing therein. By preventing movement of these magnetic vortices, the material's critical current density can be substantially increased before the material assumes normal, non-superconducting current conducting operation.

The class of metal oxide superconductors unfortunately exhibit very small critical current densities. For example, these materials typically have a critical current density in the presence of magnetic fields on the order of 5–10 amps/cm$^2$, at liquid nitrogen temperatures, while other practical superconductors typically are capable of supporting current densities on the order of 10,000–100,000 amps/cm$^2$. As a result, these metal oxide materials have hereto fore been of limited use in superconducting applications. Recent investigations have indicated that low critical electric current density values are not an intrinsic problem with metal oxide superconductors, since single crystal, thin film metal oxide superconducting materials have been produced which are capable of supporting very large current densities.

The present invention addresses the aforementioned limitations of the prior art in that it contemplates the orientation of the crystal axes of a metal oxide superconducting material in the form of a powder comprised of single crystal particles along preferential directions for increasing the critical current density of the superconductor. In one embodiment, the crystal particles are aligned by means of a magnetic field applied while the material is in a superconducting state, while another embodiment involves the substitution of rare-earth or other magnetic ions in the metal oxide superconducting material and the application of an aligning magnetic field while in a normal, non-superconducting state.

OBJECTS AND SUMMARY OF THE INVENTION

Accordingly, it is an object of the present invention to provide for the orientation of the crystals of a polycrystalline metal oxide superconductor in a preferential direction in order to substantially enhance its current-carrying capacity.

Another object of the present invention is to provide for the alignment in a preferred direction of the crystals of a polycrystalline metal oxide superconductor which is in the form of a flake-like powder using a magnetic field.

Yet another object of the present invention is to align the individual flake-like crystal particles of a superconducting material in the form of a loose matrix ceramic slip using a magnetic field such that the c-axis of each of the crystals corresponding to its weakly-superconducting direction is aligned parallel to the short dimension of the flake and the c-axes of all of the crystal particles are aligned in parallel to permit substantially increased current transport from grain to grain.

It is a further object of the present invention to apply an electromagnetic torque to the crystal particles of a metal oxide superconductor in the form of a loose matrix in order to align the axes of the superconducting directions of the crystals and thus facilitate current transport between adjacent grains.

Still another object of the present invention is to make use of the anisotropy of the paramagnetic susceptibility of rare-earth ions substituted into a polycrystalline superconducting metal oxide material to orient the particles in a preferred direction upon the application of a magnetic field thereto.

The present invention contemplates the orientation of the crystal axes of a metal oxide superconducting material in the form of a powder comprised of single crystal particles along preferential directions for increasing the critical current density of the superconducting material. Each of the superconducting crystal particles has an orthorhombic structure and is anisotropic in its superconducting characteristic such that the weakly-superconducting c-axis of the crystals is aligned parallel to the short dimension of the crystal particle. By applying a magnetic field to the superconducting metal oxide in a loose matrix form, the axes along which each of the crystal particles is superconducting may be aligned to facilitate current transport across grain boundaries. In another embodiment, the anisotropic paramagnetic susceptibility of rare-earth ions substituted into the loose matrix of superconducting metal oxide particles is used, upon the application of a magnetic field, to align the metal oxide crystal particles in a common orientation. The first approach is used with the metal oxide crystal particles in a superconducting state, while the second approach can be carried out with the material in a normal conducting state.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DESCRIPTION OF THE PREFERRED EMBODIMENT

Figure 1:
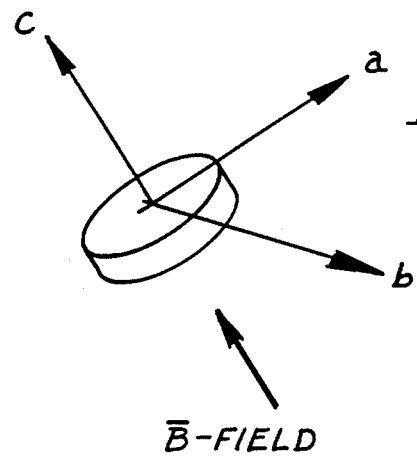
FIG. 1 is a simplified schematic diagram illustrating the interaction of an electromagnetic field upon a disc-like crystal particle of a metal oxide superconducting material in aligning the particles along a common direction.

Initial measurements on polycrystalline samples of oxide superconductors such as $YBa_2Cu_3O_{7-X}$ (where $0<X<0.5$) have shown that the current carrying capacity of these materials is not large enough to allow these materials to serve in practical applications. For example, recent measurements have indicated that these materials are only capable of supporting current densities on the order of 100-1000 amps/cm$^2$ at a temperature on the order of 77° K. in zero magnetic field. This current carrying capacity is clearly inadequate from a practical standpoint when compared with critical current densities on the order of 10,000-100,000 amps/cm$^2$ generally available in other superconducting materials. In addition, these limited current densities observed in metal oxide superconductors of this type are substantially reduced (as much as 100 times less) by the application of relatively small magnetic fields. Recent work performed at International Business Machines (IBM) as described at the American Ceramic Society Meeting in Pittsburgh, Pennsylvania, in April 1987 indicates that this is not an intrinsic problem with these metal oxide superconducting materials, since textured, thin-film materials have been produced which are capable of supporting very large current densities ($<100,000$ amps/cm$^2$). The aforementioned IBM work further indicates that the a- and b-directions, i.e., within the basal plane, of the orthorhombic $YBa_2Cu_3O_{7-X}$ are capable of supporting on the order of 30–100 times the critical current density which can be achieved in the c-direction, i.e., normal to the basal plane.

The reason for this inability of bulk metal oxide superconductors to support the large current densities necessary in virtually all practical applications appears to be a lack of alignment between adjacent grains of $YBa_2Cu_3O_{7-X}$ which carry the current in the superconducting state. This lack of alignment between adjacent grains is believed to restrict current transport to that available only by means of Josephson tunnelling and thus represents a severe limitation on current handling capability in magnetic fields. Evidence to support this finding can be found in both the small current densities and the strong field dependence of the conductivity of these materials.

This problem is avoided in the present invention by orienting the crystalline axes of different grains of these metal oxide superconducting materials along common directions to facilitate current transport across these grain boundaries. Polycrystalline oxide superconductors in accordance with the present invention are comprised of particles each of which is essentially a single crystal and which may be synthesized by either (1) growing bulk single crystals and grinding these single crystals into a powder, or (2) carrying out long-term annealing of powder samples of these polycrystalline metal oxide materials at temperatures near the melting temperature in order to promote large single crystal grain growth, followed by the grinding of these materials into fine powders.

In one approach leading to the present invention, a metal oxide superconductor such as $YBa_2Cu_3O_{7-X}$ (where $0<X<0.5$) is provided in powder form using any one of several conventional methods well known to those skilled in the relevant arts. This polycrystalline powder is then pressed into a compact form such as in the shape of pellets by means of a hydrostatic press in a conventional manner. The compacted polycrystalline powder is then heated to a temperature on the order of its melting point, i.e., to a temperature in the range of 950°–1000° C. for yttrium barium copper oxide which has a melting point of approximately 1025° C. The metal oxide material is sintered at these high temperatures for an extended period of time, e.g., on the order of 20–60 hours, in order to induce large grain growth. After sintering the metal oxide material at the aforementioned temperatures for the stated period of time, grains on the order of 100 microns in diameter are produced in the compacted crystal structure.

The sintered, large grained metal oxide crystal structure is then ground to a powder comprised of single crystal particles. The thus formed superconducting powder has a flake-like morphology such that the c-axis of the individual crystals is aligned parallel to the short dimension of the disc-like flake. The metal oxide particles thus take on the general form of a flattened disc where the a- and b-directions are in the plane of the disc and the c-axis is oriented generally perpendicular to the plane of the disc. All of the crystal particles thus have generally the same orientation. Tapes and/or wires processed from these powders have the a- and b-directions of the crystal particles oriented along the planes of the Cu and O conducting layers throughout the bulk of the wire or tape and thus permit a large critical current to be conducted within the conductors. In grinding the superconducting crystals down to a size much less than the original grain size, the compact superconducting metal oxide material is cleaved along the crystal axes resulting in platelets, or small flat bodies having the aforementioned disc-like shape. The high critical current density axes of these platelets lies in the plane of its disc-like shape.

In order to improve grain growth, impurities may be added to the metal oxide crystal material to produce larger grained structures. The addition of barium cuprate ($BaCuO_2$) to the metal oxide crystal material provides an excess of barium oxide and copper oxide, which form a low temperature eutectic with a melting temperature of about 880° C., lower than the sintering temperatures used. The low melting points of the barium oxide and copper oxide eutectic allow for increased diffusion within the metal oxide powder mixture producing larger grain growth. The other approach referred to above in producing the metal oxide crystal powder, i.e., growing bulk single crystals and grinding them into a powder, may be accomplished by growing each crystal from a similar melt using a molten bath. The difference between the two techniques lies in the amount of second phases one wishes to tolerate. In the molten bath technique large amounts of second phase must be removed from the mixture in order to obtain the desired $YBa_2Cu_3O_{7-x}$ crystals.

Referring to FIG. 1, there is shown the manner in which the disc-like shaped metal oxide crystal platelets are aligned by a magnetic field in accordance with the present invention. The magnetic field (B-field) is applied in the direction of the larger arrow in FIG. 1. Because the disc-like shaped metal oxide crystals are diamagnetic, wherein the internal magnetic field cancels out the external applied magnetic field in accordance with the Meisner effect, a surface current will be established on the disc-like shaped platelets. The surface current in each of the disc-like crystal particles generates its own magnetic moment which interacts with the applied magnetic field to align the crystal particles with the external applied magnetic field. The alignment assumed by each of the crystal particles relative to the applied magnetic field is shown in FIG. 1 and arises because of the anisotropic superconductivity of the crystal particles. Thus, each of the crystal particles, which is superconducting in its a-, b-plane, is aligned such that the plane of its disc-like shape is oriented perpendicular to the external applied magnetic field. As a result, each of the c-axes of the crystal particles, along which the crystal particle is weakly-superconducting, are aligned parallel to the direction of the applied external magnetic field. In this manner, all of the metal oxide crystal particles are oriented along common axes. Because the metal oxide crystal particles possess a surface current only when in the superconducting state, alignment of the metal oxide crystal particles along common axes by means of an applied magnetic field must be performed while the metal oxide crystal material is in a superconducting state, which is typically at low, or liquid nitrogen temperatures.

The present invention also contemplates using a paramagnetic material at room temperature to align the crystals or by substituting a rare earth material for one of the components of the superconducting metal oxide material one can use the anisotropic paramagnetism of the rare earth compounds to align the crystals. For example, where yttrium barium copper oxide is the superconducting material, substitution of the rare earth atoms for the yttrium will render the metal oxide material paramagnetic such that its induced internal magnetic field will be aligned with the external applied magnetic field. In this case, the plane of the disc-like shaped crystal particles will be aligned generally with the applied magnetic field in a direction independent of which magnetic rare earth element is chosen. In either case, the application of a magnetic field to the anisotropic superconducting metal oxide crystal particles will result in their common alignment along a preferential direction. In the latter example, various rare earth atoms, such as dysprosium, holmium and erbium, may be substituted for the yttrium in the superconducting metal oxide to permit crystals of this material when reduced to particle-like form to be aligned along common axes with the application of a magnetic field thereto. The magnetic field may be applied to the metal oxide crystal particles dispersed in a liquid by conventional means such as by an electromagnet or permanent magnet.

Figure 2:
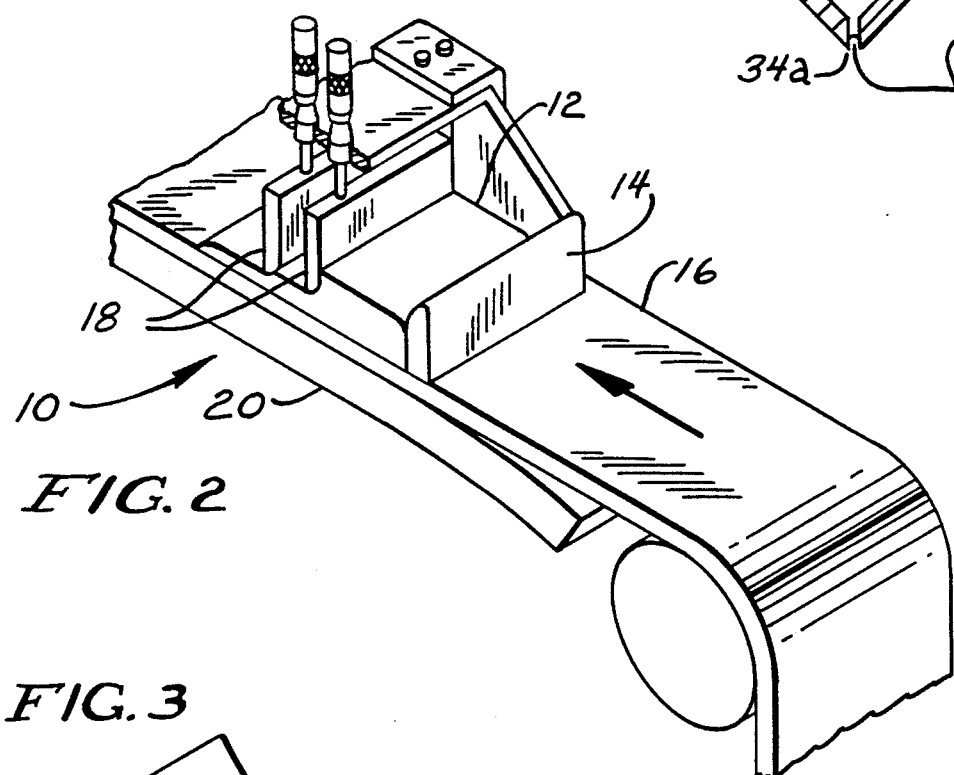
FIG. 2 is a simplified schematic diagram of a tape casting apparatus to which a magnetic field is applied for use in the preferential orientation of the crystal particles of a metal oxide superconducting material in accordance with the present invention.

After producing the metal oxide crystal powders in which the particles are predominantly single crystallites the aligning procedure as described above would be combined with various processing approaches to produce conductors with the crystal particles aligned along common axes. For example, as shown in FIG. 2, a tape casting apparatus 10 may be used in conjunction with the magnetic alignment of the crystal particles along common axes. In the tape casting apparatus 10, a slip 12, comprised of a suitable mixture of single crystal powder, binders and plasticizers, is spread onto a tempered glass bed or other suitable flat surface 20 with a doctor blade 18 which produces the desired thickness. As the slip is drawn beneath the doctor blades 18, the individual crystal particles contained within are oriented such that their c-axes are aligned generally perpendicular with the plane of the tape. The application of the magnetic field would greatly enhance this alignment technique.

Figure 3:
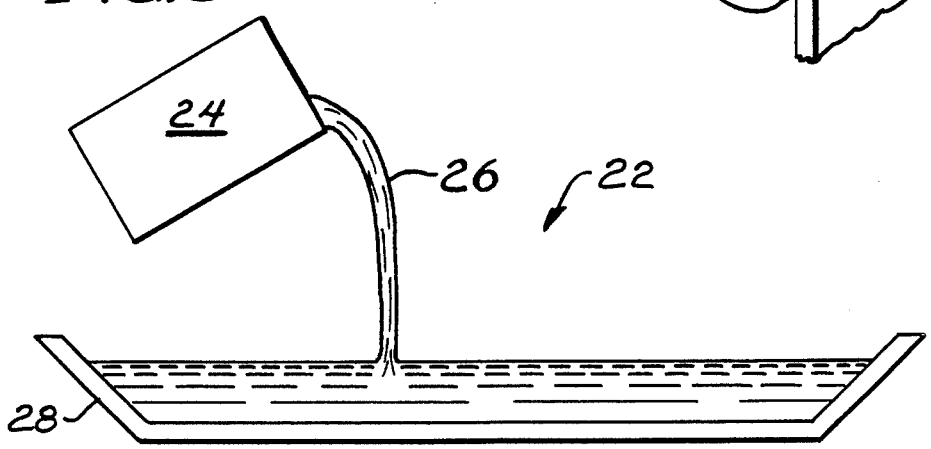
FIG. 3 is a simplified schematic diagram of a slip casting apparatus to which a magnetic field is applied for use in the preferential orientation of the crystal particles of a metal oxide superconducting material in accordance with the present invention.

Referring to FIG. 3, there is shown another alternative approach which can be used for increasing the common alignment of the individual crystal particles of the metal oxide powder. In the approach illustrated in FIG. 3, a slip casting arrangement 22 includes a plaster mold 28 into which a mixture 26 of the metal oxide powder crystals and a binder and solvent are poured from a container 24. The plaster mold 28 absorbs the binder and solvent leaving only the metal oxide crystals remaining in the plaster mold. Because of the plate-like shape of the individual crystals and their tendency not to remain in an on-end orientation, the crystal particles remaining in the plaster mold 28 are generally aligned in a flat orientation with their shorter c-axis aligned generally vertically. It should be noted here that for all of these descriptions of process techniques, alignment occurs in the absence of the magnetic field. However, it is greatly enhanced by the application of the magnetic field.

Figure 4:
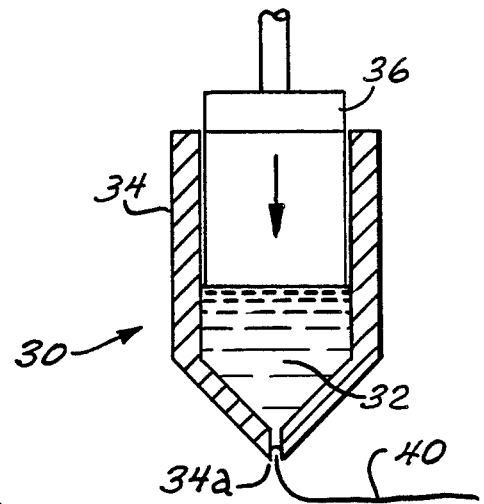
FIG. 4 is a simplified schematic diagram of an extrusion arrangement to which a magnetic field is applied for use in the preferential orientation of the crystal particles of a metal oxide superconducting material in accordance with the present invention.

Referring to FIG. 4, there is shown yet another arrangement for increasing the common alignment of the metal oxide crystals along a preferential axis. In the approach of FIG. 4, an extrusion apparatus 30 includes a container 34 within which a partially dried slip containing the metal oxide powder 32 having a putty-like texture is disposed. The container 34 includes a small tapered aperture 34a on a lower portion thereof. The downward displacement of a pusher element 36 against the slip 32 within the container 34 forces the mixture out of the container's aperture 34a. The thus extruded metal oxide powder is in the form of a wire 40. The physics describing alignment in the tape casting techniques also operate in this technique and hence one can expect orientation using extrusion as well. It should be noted here that the additional alignment procedures illustrated in FIGS. 2, 3 and 4 are not essential for carrying out the magnetic alignment of the present invention, but are discussed to describe how further alignment of the crystal particles may be accomplished.

There has thus been shown an improved metal oxide superconducting material with enhanced current-carrying capability. The metal oxide material is comprised of a powder wherein each of the particles is a single crystal having an orthorhombic structure and an anisotropic conductive characteristic. Each of the crystals is aligned along a preferential direction such that the desired direction of current conduction is aligned with the high critical current layers of the superconductor crystal structure. A magnetic field is applied to the metal oxide material for aligning its crystal particles in a preferential orientation. This may be accomplished at liquid nitrogen temperatures or at much higher temperatures where a rare earth material is substituted into the metal oxide superconducting material. Additional crystal particle alignment may be realized by mechanical means such as slip casting, tape casting, or extrusion.

While particular embodiments of the present invention have been shown and described, it will be obvious to those skilled in the art that changes and modifications may be made without departing from the invention in its broader aspects. For example, while the present invention is described in terms of a superconducting crystal powder comprised of yttrium barium copper oxide, this invention contemplates a superconducting material comprised of virtually any rare earth metal oxide having an orthorhombic crystal structure which possesses an anisotropic superconducting characteristic. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The embodiments of the invention in which an exclusive property or privilege is claimed are defined as follows:

1. A method of forming a superconducting metal oxide with improved current carrying capacity wherein said superconducting metal oxide has a polycrystalline structure and is anisotropically superconducting having one or more longer crystal axes along which said metal oxide is superconducting, said method comprising the steps of:

reducing the superconducting metal oxide to a flake-like, powder form, wherein the metal oxide powder is comprised of particles of single crystals, said superconducting metal oxide having a characteristic critical temperature below which it is superconducting;

mixing said metal oxide single crystal particles with binder and solvent to form a slip;

lowering the temperature of said metal oxide single crystal particles in said slip to said characteristic critical temperature;

directing a magnetic field onto said slip to orient said metal oxide single crystal particles along a preferential direction such that said one or more longer axes of each of said metal oxide crystals are in general alignment; and removing the binder and solvent from the oriented metal oxide single crystal particles and sintering said metal oxide single crystal particles.

2. The method of claim 1 further comprising the step of mixing said metal oxide single crystal particles with a liquid comprised of a solvent and a dispersing agent.

3. The method of claim 2 wherein said solvent is an alcohol.

4. The method of claim 3 wherein said dispersing agent is a phosphate ester.

5. The method of claim 1 further comprising the step of heating the mixture of said metal oxide single crystal particles and said liquid after said metal oxide single crystal particles are aligned to remove the liquid therefrom.

6. The method of claim 1 further comprising the step of allowing the liquid to evaporate from the mixture of said metal oxide single crystal particles and said liquid after said metal oxide single crystal particles are aligned along said preferential direction.

7. The method of claim 1 further comprising the step of mechanically working the metal oxide single crystal particle and liquid mixture after said metal oxide single crystal particles are aligned along said preferential direction to effect further alignment of said metal oxide single crystal particles.

8. The method of claim 7 wherein the step of mechanically working the metal oxide crystal powder and liquid mixture includes tape casting the mixture.

9. The method of claim 7 wherein the step of mechanically working the metal oxide crystal powder and liquid mixture includes slip casting the mixture.

10. The method of claim 7 wherein the step of mechanically working the metal oxide crystal powder and liquid mixture includes extruding the mixture.

11. The method of claim 1 wherein said superconducting metal oxide has a characteristic critical temperature below which it is superconducting, said method further comprising the step of using the room temperature paramagnetism of the said superconducting material so as to align in a slip at room temperature.

12. The method of claim 11 wherein said superconducting metal oxide is yttrium barium copper oxide said wherein the step of converting said superconducting metal oxide to a paramagnetic material includes substantially replacing yttrium atoms in said yttrium barium copper oxide with rare earth atoms.

13. The method of claim 12 wherein said rare earth atoms are dysprosium.

14. The method of claim 12 wherein said rare earth atoms are holmium.

15. The method of claim 12 wherein said rare earth atoms are erbium.

* * * * *